(12) United States Patent
Goemmel et al.

(10) Patent No.: US 7,336,491 B2
(45) Date of Patent: Feb. 26, 2008

(54) HEAT SINK

(75) Inventors: Frank Goemmel, Sonnefeld (DE); Roland Hammer, Marktrodach-Oberrodach (DE)

(73) Assignee: Lear Corporation, Southfield, MI (US)

( * ) Notice: Subject to any disclaimer, the term of this patent is extended or adjusted under 35 U.S.C. 154(b) by 149 days.

(21) Appl. No.: 11/162,305

(22) Filed: Sep. 6, 2005

(65) Prior Publication Data
US 2007/0053164 A1    Mar. 8, 2007

(51) Int. Cl.
*H05K 7/20* (2006.01)

(52) U.S. Cl. .................. 361/707; 361/704; 361/719; 361/720; 361/715; 361/730; 361/736; 361/826; 361/697; 361/807; 361/735; 361/709; 361/710; 361/714; 361/723; 361/535; 361/538; 361/540; 174/16.1; 174/16.2; 174/52.1; 174/54; 174/58; 174/252; 174/254; 257/707; 257/E23.066; 257/E23.068; 165/67; 165/80.2; 439/71; 439/76.2; 439/78; 439/331; 439/510; 439/511; 439/949

(58) Field of Classification Search ............... 361/704, 361/719, 720, 714, 715, 730, 736, 826, 807, 361/709, 723, 535, 538, 540, 697, 735; 257/707, 257/E23.066, E23.068; 174/52.1, 160, 54, 174/58, 16.1, 16.2, 252, 254; 165/67, 80.2; 439/76.2, 78, 510, 511, 949, 71
See application file for complete search history.

(56) References Cited

U.S. PATENT DOCUMENTS

| | | | | |
|---|---|---|---|---|
| 4,278,311 A | * | 7/1981 | Scheingold et al. | 439/71 |
| 4,738,024 A | * | 4/1988 | Eberhardt | 29/830 |
| 4,899,256 A | * | 2/1990 | Sway-Tin | 361/715 |
| 5,091,823 A | * | 2/1992 | Kanbara et al. | 361/697 |
| 5,184,283 A | * | 2/1993 | Hamel | 361/736 |
| 5,309,979 A | | 5/1994 | Brauer | |
| 5,311,060 A | | 5/1994 | Rostoker et al. | |
| 5,402,313 A | * | 3/1995 | Casperson et al. | 361/710 |
| 5,408,383 A | * | 4/1995 | Nagasaka et al. | 361/707 |
| 5,508,884 A | | 4/1996 | Brunet | |
| 5,793,613 A | | 8/1998 | Poinelli et al. | |
| 5,796,585 A | * | 8/1998 | Sugiyama et al. | 361/735 |
| 5,915,463 A | | 6/1999 | Romero | |

(Continued)

FOREIGN PATENT DOCUMENTS

DE    3612862 A1    11/1986

(Continued)

OTHER PUBLICATIONS

Combined Search and Examination Report under Sections 17 and 18(3); Application No. GB0617519.4; Applicant: Lear Corporation; Date of Report: Dec. 7, 2006.

(Continued)

*Primary Examiner*—Courtney Smith
(74) *Attorney, Agent, or Firm*—Brooks Kushman P.C.

(57) ABSTRACT

A heat dissipation device for electrical components includes an outer surface and an inner surface. The outer surface is configured for mounting the electrical components thereon, wherein the components are mounted to the outer surface to allow the transfer of heat from the electrical components to the heat dissipation device and ambient air. The inner surface defines a cavity within the heat dissipation device that also enables housing of the electrical components.

18 Claims, 4 Drawing Sheets

U.S. PATENT DOCUMENTS

| | | | | |
|---|---|---|---|---|
| 5,995,380 | A | * 11/1999 | Maue et al. | 361/826 |
| 6,185,100 | B1 | * 2/2001 | Bentz et al. | 361/704 |
| 6,441,520 | B1 | * 8/2002 | Grant | 310/68 R |
| 6,583,988 | B1 | * 6/2003 | Lyons et al. | 361/719 |
| 6,665,195 | B1 | * 12/2003 | Drabon et al. | 361/807 |
| 6,898,072 | B2 | * 5/2005 | Beihoff et al. | 361/676 |
| 6,898,084 | B2 | 5/2005 | Misra | |
| 7,050,305 | B2 | * 5/2006 | Thorum | 361/719 |
| 7,053,299 | B2 | * 5/2006 | Zimmerman | 174/528 |
| 7,078,803 | B2 | * 7/2006 | Tilton et al. | 257/714 |
| 7,185,696 | B2 | 3/2007 | Schaper | |
| 7,190,589 | B2 | * 3/2007 | Caines et al. | 361/707 |
| 2002/0008310 | A1 | * 1/2002 | Kinsman et al. | 257/686 |
| 2003/0085453 | A1 | 5/2003 | Eyman et al. | |

FOREIGN PATENT DOCUMENTS

| | | |
|---|---|---|
| DE | 8901279 U1 | 3/1989 |
| DE | 19645636 C1 | 3/1998 |
| DE | 19712099 A1 | 5/1998 |
| DE | 19701731 A1 | 7/1998 |
| DE | 19722602 C2 | 12/1998 |
| DE | 10161536 B4 | 6/2003 |
| DE | 10326458 A1 | 1/2005 |
| DE | 102005035378 B3 | 11/2006 |
| EP | 0822647 A1 | 2/1998 |
| JP | 10200281 A | 1/1997 |
| JP | 3096261 A | 9/1998 |

OTHER PUBLICATIONS

Office Action from the German Patent & Trademark Office, dated Sep. 7, 2007, 7 pages.

* cited by examiner

HEAT SINK

TECHNICAL FIELD

The present invention relates to a device for dissipating heat from electrical components.

BACKGROUND

Heat dissipation devices, such as heat sinks are commonly used in the electronics industry to dissipate heat from electrical components. Conventional heat sinks are comprised of a metallic material that is formed to have extruded profiles, which enable the transfer of heat from the electrical components to the heat sink. In some cases, the heat sink is comprised of a solid metallic material that is mounted adjacent to the electrical components. Alternatively, the heat sink may be designed as an electronic module wherein the electrical components are assembled within an inner cavity of the heat sink. An example of this alternative embodiment includes sub-woofer amplifiers that are commonly used in the automotive industry. In such an implementation, the heat sink includes an extruded profile (internally and externally) that include a plurality of external fins for dissipating heat from electrical components that are enclosed within a cavity of the heat sink. Conventional electronics that are mounted within the cavity of the heat sink include surface mount devices (SMD) and leaded devices.

SMDs are electronic components which have terminal leads that are part of the component body, thus allowing direct mounting on the surface of a printed circuit board. Leaded devices are those devices which are mounted by their electrical leads through holes within the printed circuit board. Conventionally, the installation of SMDs and leaded devices within a heat sink has been accomplished through the use of springs and bolts which are configured to stabilize these components within the heat sink. Additionally, these springs and bolts are fastened or press-fit onto the internal extrusions and are formed to contact the electrical components. It is recognized that the requirement of springs and bolts increases manufacturing and assembly time, the cost of the electrical component/heat sink assembly, and the potential for product malfunction. Furthermore, the extruded internal profile of the conventional heat sinks increases the complexity of the heat sink manufacturing process.

The present invention was conceived in the view of these and other disadvantages of conventional heat sinks.

SUMMARY

The present invention provides a heat dissipation device for electrical components. The device includes an outer surface configured for mounting the electrical components thereon, wherein the components are mounted to the outer surface to allow the transfer of heat from the electrical components to the heat dissipation device and ambient air. The heat dissipation device also includes an inner surface that defines a cavity within the heat dissipation device.

A method for dissipating heat from electrical components through the use of a heat dissipation device is also disclosed. The method includes configuring the heat dissipation device to have an outer surface and an inner surface, wherein the inner surface defines a cavity within the heat dissipation device. The method also includes mounting the electrical components on the outer surface of the heat dissipation device to allow the transfer of heat from the electrical components to the heat dissipation device and ambient air.

The above embodiments and other embodiments, features, and advantages of the present invention are readily apparent from the following detailed description of the best mode for carrying out the invention when taken in connection with the accompanying drawings.

BRIEF DESCRIPTION OF THE DRAWINGS

The features of the present invention which are believed to be novel are set forth with particularity in the appended claims. The present invention, both as to its organization and manner of operation, together with further objects and advantages thereof, may be best understood with reference to the following description, taken in connection with the accompanying drawings in which:

DETAILED DESCRIPTION OF THE PREFERRED EMBODIMENT(S)

As required, detailed embodiments of the present invention are disclosed herein. However, it is to be understood that the disclosed embodiments are merely exemplary of the invention that may be embodied in various and alternative forms. The figures are not necessarily to scale, and some features may be exaggerated or minimized to show details of particular components. Therefore, specific functional details disclosed herein are not to be interpreted as limiting, but merely as a representative basis for the claims and/or as a representative basis for teaching one skilled in the art to variously employ in the present invention.

Figure 1A:
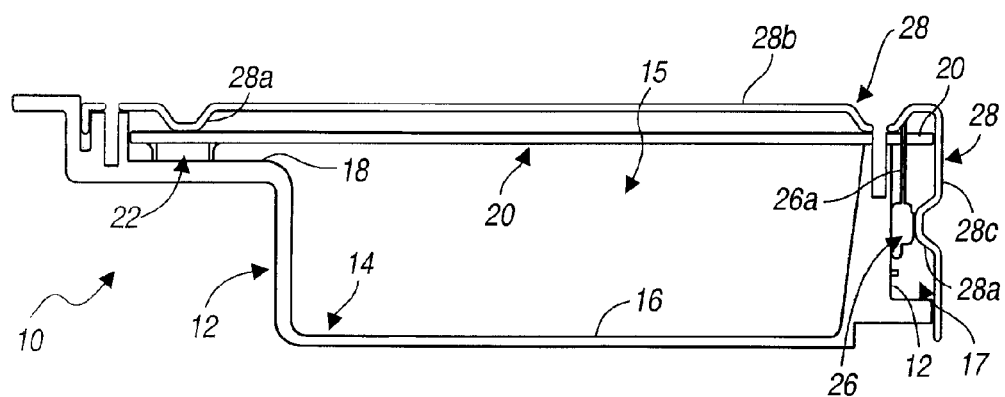
FIGS. 1A-1C illustrate multiple views of a heat sink according to an embodiment of the present invention.

Referring to FIG. 1A, a cross-sectional view of a heat sink according to an embodiment of the present invention is shown. Heat sink 10 includes an outer surface 12 and an inner surface 14. As recognized by one of ordinary skill in the art, heat sink 10 may be formed of a metallic type material such as copper, aluminum, and the like. Inner surface 14 defines a cavity 15 in which electrical components may be housed. Cavity 15 includes a lower cavity surface 16 and an upper cavity surface 18 as defined by inner surface 14.

Outer surface 12 also defines a side cavity 17. Accordingly, electrical components such as leaded device 26 may be mounted on outer surface 12 of heat sink 10. A printed circuit board (PCB) 20 may be positioned within heat sink 10 for mounting of surface mount devices (SMD) 22 and leaded device 26. Leaded device 26 is connected to PCB 20 via leads 26a. Leaded device 26 may be mounted to outer surface 12 through the use of a gap pad or a paste that is disposed between leaded device 26 and outer surface 12.

Additionally, in one embodiment, at least one side of SMD 22 contacts upper cavity surface 18 thereby enabling the dissipation of heat from SMD 22 to heat sink 10. A cover 28 having an upper cover portion 28b and a side cover portion 28c encloses cavity 15 and side cavity 17. Cover 28 includes protrusions 28a that provide a heat dissipation contact surface for SMD 22 and leaded device 26.

Figure 1B:
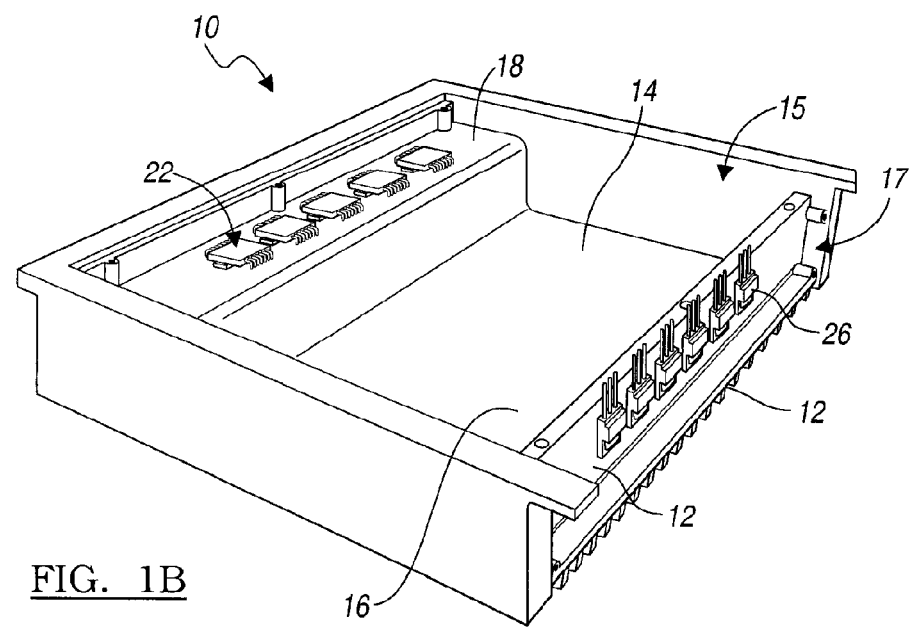

Now referring to FIG. 1B, a perspective view of heat sink 10 is shown absent PCB 20 and cover 28. FIG. 1B illustrates an embodiment wherein multiple SMDs 22 are configured to form a single row on upper cavity surface 18. Additionally, a plurality of leaded devices 26 are mounted within side cavity 17, which is defined by outer surface 12. As shown in both FIGS. 1A and 1B, inner surface 14 of heat sink 10, which includes lower cavity surface 16 and upper cavity surface 18, does not require fastening devices (e.g., bolts and springs) to secure SMDs 22. Accordingly, in one aspect of the invention, inner surface 14 does not require extrusions or projections for attaching the fastening devices. Additionally, mounting of leaded devices 26 to outer surface 12 does not require extrusions or fastening devices. As such, the process of manufacturing heat sink 10 and assembling of heat sink 10 with the electrical components is improved in contrast with conventional heat sinks.

Figure 1C:
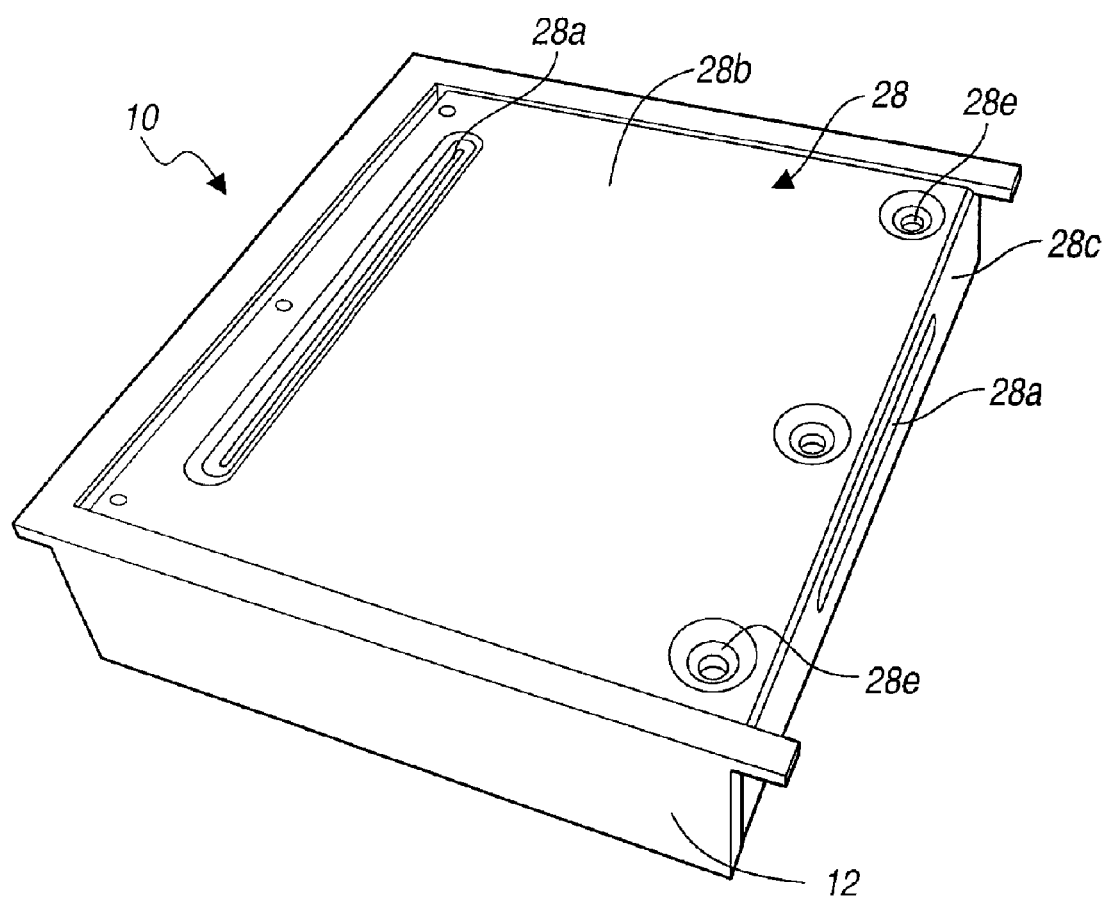

Now referring to FIG. 1C, a perspective view of heat sink 10 is shown having cover 28 attached thereto. As described above, cover 28 includes multiple protrusions 28a. Accordingly, upper cover portion 28b and side cover portion 28c both include protrusions 28a. It is recognized that the embodiments shown do not limit the scope of the present invention and other embodiments may include additional or less protrusions 28a without departing from the scope of the present invention. FIG. 1C also illustrates a plurality of mounting apertures 28 that enable mounting of cover 28 to heat sink 10.

Figure 2A:
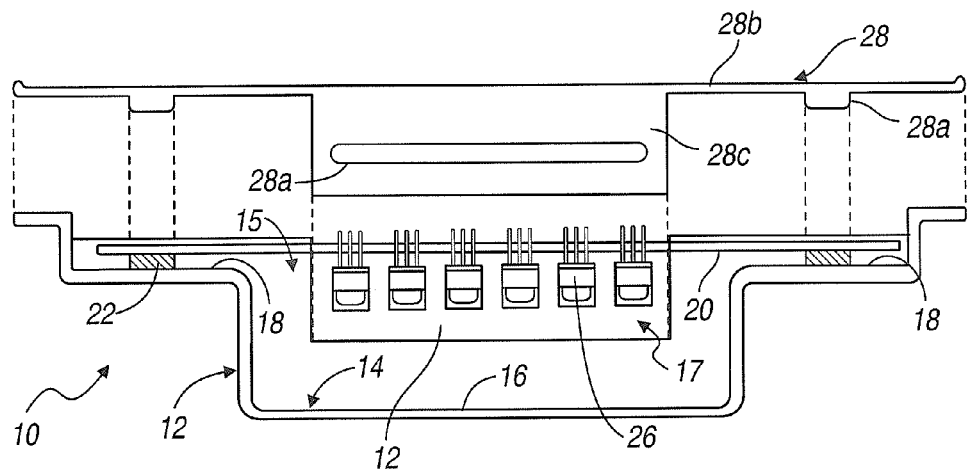
FIGS. 2A-2D illustrate multiple views of an alternative embodiment of a heat sink according to an embodiment of the present invention.

Now referring to FIG. 2A, an exploded cross-sectional view of an alternative embodiment of heat sink 10 including cover 28 is shown. The embodiment shown in FIG. 2A includes multiple upper cavity surfaces 18. As such, SMDs 22 may be mounted on one or both upper cavity surfaces 18. Leaded devices 26 are also mounted within cavity 17 as defined by outer surface 12. Each row of SMDs 22 is mounted to PCB 20. Accordingly, one side of SMD 22 contacts upper cavity surfaces 18. Protrusions 28a, as described above, are configured to provide a heat dissipation contact surface for SMDs 22 via PCB 20. Also, protrusion 28a, being integrated with side cover portion 28c is also configured to provide a heat dissipation contact surface for leaded devices 26.

Figure 2B:
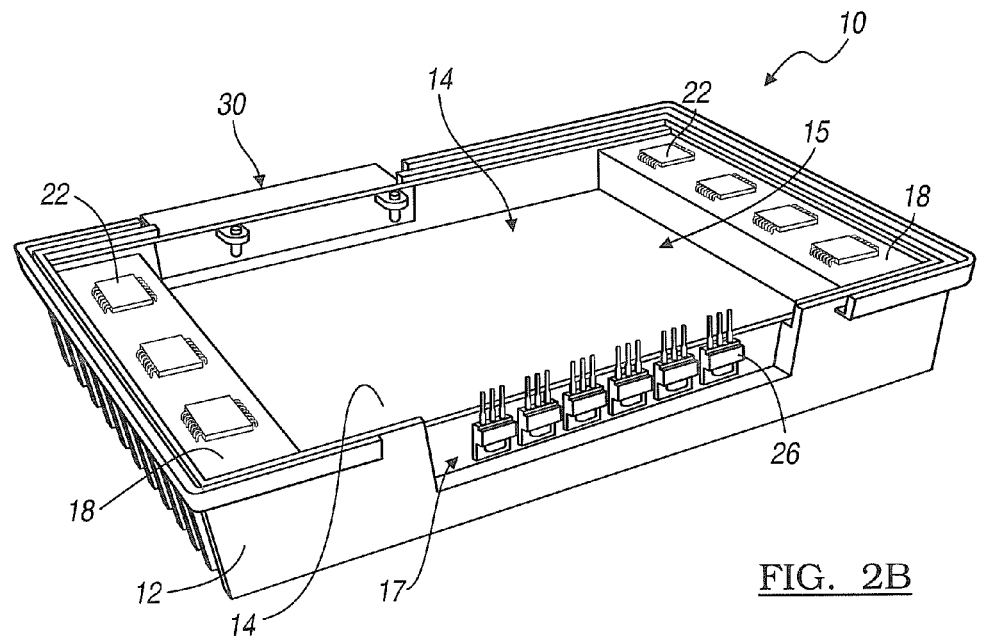

Now referring to FIG. 2B, a perspective view of heat sink 10 is illustrated. As described above, heat sink 10 may have multiple upper cavity surfaces 18 for mounting SMDs 22 thereon. FIG. 2B also illustrates a connecter terminal 30 that enables the electrical components coupled to and integrate with heat sink 10 to be connected with a power source or other adjacent systems.

Figure 2C:
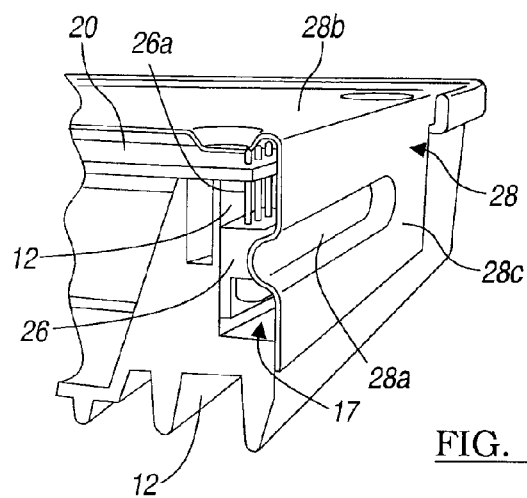

Now referring to FIG. 2C, an enlarged cross-sectional view of side cavity 17 is illustrated. As shown, leaded device 26 being mounted to outer surface 12, is connected to PCB 20 via leads 26a. Additionally, side cover portion 28c encloses cavity 17 and includes protrusion 28a which contacts leaded device 26 for dissipating heat.

Figure 2D:
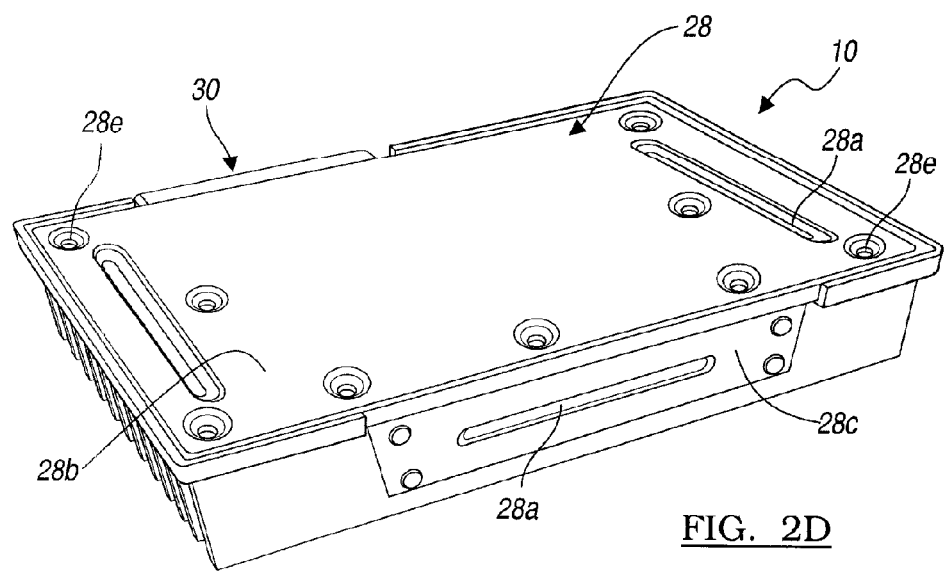

Now referring to FIG. 2D, heat sink 10 is shown having cover 28 attached thereto. As described above, cover 28 includes multiple protrusions 28a that are capable of providing a contact surface for electrical components mounted to heat sink 10. Cover 28 includes an additional protrusion 28a which provides the contact surface for the additional row of SMDs 22 (FIG. 2B). Accordingly, a connecter terminal 30 is illustrated for connecting heat sink 10 and the electrical components with adjacent electrical systems or devices.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A heat dissipation device comprising: a circuit board; at least one first electrical component having first and second portions and adapted to generate heat; at least one second electrical component having first and second portions and adapted to generate heat, wherein at least one first portion of the first and second electrical components are coupled to the circuit board and at least one second portion of the first and second electrical components are arranged to extend away from the circuit board; an outer surface configured to support the circuit board and to receive the at least one second portion of the first and second electrical components so that the outer surface transfers heat away from the at least one second portion of the first and second electrical components; and a cover extending in at least one of a first direction such that the cover extends over the circuit board and the outer surface and in a second direction perpendicular to he first direction, wherein the cover is in thermal communication with the at least one of the first and second portions of the first and second electrical components to transfer heat away from the device.

2. The device according to claim 1, wherein the at least one second portion of the first and second electrical components are coupled to the outer surface through the use of a gap pad or a paste that is disposed between the at least one second portion of the first and second electrical components and the outer surface.

3. The device according to claim 1, wherein the cover includes one or more protrusions configured to provide a contact surface for contacting at least one of the circuit board and the first and second electrical components.

4. The device according to claim 1, wherein the cover includes a top cover portion and a side cover portion, the top cover portion extends in the first direction over the first electrical component positioned on the outer surface and the circuit board and the side cover portion extends in the second direction over the second electrical component disposed on a side cavity of the outer surface.

5. The device according to claim 1, wherein the first electrical components includes surface mount devices and the second electrical components includes leaded devices, wherein at least one of the surface mount devices and the leaded devices are in thermal communication with the outer surface and the cover.

6. The device according to claim 1, further comprising an inner surface that is void of extrusions.

7. The device according to claim 1, further comprising an inner surface that is void of fastening devices.

8. A method of transferring heat from at least one first electrical component each having first and second portions and at least one second electrical component each having first and second portions, the method comprising: coupling at least one first portion of the first and second electrical components to a circuit board, wherein at least one second portion of the first and second electrical components extend away from the circuit board; supporting the circuit board with an outer surface; coupling the at least one second portion of the first and second electrical components to the outer surface so that outer surface is in thermal communication with the at least one second portion of the first and second electrical components; providing a cover that extends in at least one of a first direction such that the cover extends over the circuit board and the outer surface and in a second direction that is perpendicular to the first direction, wherein the cover is in thermal communication with at least one of the first and second portions of the first and second electrical components; transferring heat away from the at least one of the first and second portions of the first and second electrical components with the cover; and transferring heat away from the at least one second portion of the first and second electrical components with the outer surface.

9. The method according to claim 8, wherein the at least one second portion of the first and second electrical components are coupled to the outer surface through the use of a gap pad or a paste that is disposed between the at least one second portion of the first and second electrical components and the outer surface.

10. The method according to claim 8, wherein the cover includes one or more protrusions configured to provide a contact surface for contacting at least one of the circuit board and the first and second electrical components.

11. The method according to claim 8, wherein the cover includes a top cover portion and a side cover portion, the top cover portion extends in the first direction over the first electrical component positioned on the outer surface and on the circuit board and the side cover portion extends in the second direction over the second electrical component positioned on a side cavity of the outer surface.

12. The method according to claim 8, wherein the first electrical components include surface mount devices and the second electrical components include leaded devices, wherein at least one of the surface mount devices and the leaded devices are in thermal communication with the cover.

13. The method according to claim 8, further comprising an inner surface that is void of extrusions.

14. The method according to claim 8, further comprising an inner surface that is void of fastening devices.

15. A heat sink device for transferring heat generated from at least one first electrical component each having first and second portions and at least one second electrical component each having first and second portions, the device comprising: a circuit board for mounting at least one first portion of the first and second electrical components thereon, wherein at least one second portion of the first and second electrical components extend away from the circuit board; an outer surface configured to support the circuit board, to receive the at least one second portion of the first and second electrical components, and to transfer heat away from the at least one second portion of the first and second electrical components; and a cover extending in at least one of a first direction such that the cover extends over the circuit board and the outer surface and in a second direction that is perpendicular to the first direction, wherein the cover is adapted to contact at least one of the circuit board, the at least one of the first and second portions of the first electrical components, and the at least one of the first and second portions of the second electrical components to transfer heat away from the device.

16. The heat sink device of claim 15, wherein the cover includes one or more protrusions to provide a contact surface for contacting the at least one of the circuit board and the first and second electrical components.

17. The device according to claim 15, further comprising an inner surface that is void of extrusions.

18. The device according to claim 15, further comprising an inner surface that is void of fastening devices.

* * * * *

UNITED STATES PATENT AND TRADEMARK OFFICE
CERTIFICATE OF CORRECTION

PATENT NO. : 7,336,491 B2 Page 1 of 1
APPLICATION NO. : 11/162305
DATED : February 26, 2008
INVENTOR(S) : Goemmel et al.

It is certified that error appears in the above-identified patent and that said Letters Patent is hereby corrected as shown below:

Column 4, line 18 replace "he" with --the--.

Signed and Sealed this

Second Day of September, 2008

JON W. DUDAS
*Director of the United States Patent and Trademark Office*